US009041383B2

(12) United States Patent
Bengtsson et al.

(10) Patent No.: US 9,041,383 B2
(45) Date of Patent: May 26, 2015

(54) METHOD AND DEVICE FOR LINEARIZING A TRANSFORMER

(71) Applicants: Tord Bengtsson, Vasteras (SE); Henrik Johansson, Vasteras (SE); Stefan Roxenborg, Vasteras (SE); Joseph Menezes, Vasteras (SE); Zoltan Nagy, Vasteras (SE); Mikael Sehlstedt, Arboga (SE)

(72) Inventors: Tord Bengtsson, Vasteras (SE); Henrik Johansson, Vasteras (SE); Stefan Roxenborg, Vasteras (SE); Joseph Menezes, Vasteras (SE); Zoltan Nagy, Vasteras (SE); Mikael Sehlstedt, Arboga (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 14/030,456

(22) Filed: Sep. 18, 2013

(65) Prior Publication Data

US 2014/0015510 A1 Jan. 16, 2014

Related U.S. Application Data

(63) Continuation of application No. PCT/EP2011/054165, filed on Mar. 18, 2011.

(51) Int. Cl.
*G01R 15/18* (2006.01)
*G01R 15/20* (2006.01)
*G01R 19/20* (2006.01)
*H01F 27/42* (2006.01)

(52) U.S. Cl.
CPC ..................................... *H01F 27/42* (2013.01)

(58) Field of Classification Search
CPC .................................................... G01R 15/186
USPC ....... 324/547, 117 R, 126, 127; 323/355, 356
See application file for complete search history.

(56) References Cited

U.S. PATENT DOCUMENTS

| | | | | |
|---|---|---|---|---|
| 3,881,149 | A | 4/1975 | Kiko | |
| 4,054,829 | A | 10/1977 | Searle | |
| 4,198,595 | A * | 4/1980 | Milkovic | 323/357 |
| 4,371,832 | A | 2/1983 | Wilson et al. | |
| 5,369,355 | A | 11/1994 | Roe | |
| 5,568,047 | A * | 10/1996 | Staver et al. | 324/127 |
| 5,592,133 | A * | 1/1997 | Kawana | 333/25 |
| 5,751,284 | A | 5/1998 | Suptitz et al. | |
| 6,466,627 | B1 * | 10/2002 | Kuwana | 375/258 |

(Continued)

OTHER PUBLICATIONS

Bronshtein, et al.; "A Method for Parameter Extraction of Piezoelectric Transformers"; IEEE Transactions on Power Electronics; vol. 26, No. 11; Nov. 1, 2011; pp. 3395-3401.

International Preliminary Report on Patentability Application No. PCT/EP2011/054165 Completed: Apr. 24, 2013 17 pages.

(Continued)

*Primary Examiner* — Huy Q Phan
*Assistant Examiner* — Giovanni Astacio-Oquendo
(74) *Attorney, Agent, or Firm* — St. Onge Steward Johnston & Reens LLC

(57) ABSTRACT

A method for linearizing voltage transmission through a transformer including a magnetic core and, input and output windings. A measurement signal is supplied to the input winding at a first frequency and an output signal is measured at the output winding of the transformer, wherein the voltage of the measurement signal may be so low that the transformer operates in a non-linear region. The method includes, for a conditioning signal, selecting a second frequency different from the first frequency, defining an amplitude value of the conditioning signal and supplying the conditioning signal to the input winding at the second frequency with the defined amplitude value so that the transformer operates in its linear region.

16 Claims, 4 Drawing Sheets

(56) References Cited

U.S. PATENT DOCUMENTS

| | | | | |
|---|---|---|---|---|
| 6,590,380 | B2 * | 7/2003 | Edel | 324/127 |
| 6,674,278 | B1 | 1/2004 | Uesugi | |
| 7,145,321 | B2 * | 12/2006 | Sandquist et al. | 324/117 R |
| 7,365,605 | B1 | 4/2008 | Hoover | |
| 7,656,149 | B2 * | 2/2010 | Nakajima | 324/127 |
| 8,068,615 | B2 * | 11/2011 | Jakowski | 381/59 |
| 2004/0169421 | A1 | 9/2004 | Eaton et al. | |
| 2005/0110480 | A1 | 5/2005 | Martin et al. | |
| 2007/0007929 | A1 | 1/2007 | Lee et al. | |
| 2007/0263883 | A1 * | 11/2007 | Jakowski | 381/110 |

OTHER PUBLICATIONS

International Search Report and Written Opinion of the International Searching Authority Application No. PCT/EP2011/054165 Completed: Dec. 9, 2011; Mailing Date: Dec. 19, 2011 14 pages.

Hamrita, et al.; "On-Line Correction of Errors Introduced by Instrument Transmission-Level Steady-State Waveform Measurements"; IEEE Transactions on Power Delivery; vol. 15, No. 4; Oct. 1, 2000; 5 pages.

Siemens SIP • 2008: 11 Generator Protection / 7UM62 (See p. 8 and figure 11/55.).

Office Action from Russia Application No. 2013142380/28(064965) Issued: Dec. 11, 2014 11 pp.. X.

* cited by examiner

METHOD AND DEVICE FOR LINEARIZING A TRANSFORMER

FIELD OF THE INVENTION

The present invention relates to the field of linearizing voltage transmission through a transformer, wherein the transformer includes a magnetic core and input and output windings, wherein a measurement signal is supplied to the input winding at a frequency and an output signal is measured at the output winding of the transformer, wherein the voltage of the measurement signal may be so low that the transformer operates in a non-linear region.

BACKGROUND OF THE INVENTION

Transformers are used for converting voltages and currents in electrical circuits and power systems. They are essential components for power system protection and control. Where a voltage or current is too large to be conveniently used by an instrument, it can be scaled down to a standardized low value. Furthermore, transformers can provide galvanic isolation for measurement, protection and control circuitry from the high currents or voltages present on the circuits being measured or controlled.

Such a transformer is only capable of providing linear signal transfer in a limited range, which means that a transformer must be carefully designed for its intended use so that it operates in a linear region. However, under some circumstances, the amplitude of the voltage supplied to the transformer may be chosen below the linear range. This may happen because stronger signals that may occasionally occur must not overload the transformer and there is a limit to the design possibilities. The low signal amplitude results in non-linear magnetization current through a transformer connected in the measurement chain. Consequently, the non-linear magnetization current makes the transformer operate in a non-linear region, leading to inaccurate measurement. This will become worse when such a non-linearity behavior is propagating in a measurement circuit comprising several transformers.

U.S. Pat. No. 5,369,355 discloses a method and a system for linearizing the performance of electrical transformers using negative feedback. A circuit arrangement is configured to compensate a three-winding transformer by using negative feedback generated by an operational amplifier to result in an improved low-end frequency response, reduced harmonic distortion, and substantially resistive input and output impedances.

However, both solutions are expensive due to the auxiliary or the negative feedback circuit arrangements.

SUMMARY OF THE INVENTION

One object of the present invention is to provide a method for linearizing voltage transmission through a transformer including a magnetic core and input and output windings, wherein a measurement signal is supplied to the input winding at a first frequency and an output signal is measured at the output winding of the transformer, wherein the voltage of the measurement signal may be so low that the transformer operates in a non-linear region.

The object of the invention is achieved by a method. Such a method comprises for a conditioning signal, selecting a second frequency different from the first frequency, defining an amplitude value of the conditioning signal and supplying the conditioning signal to the input winding at the second frequency with the defined amplitude value so that the transformer operates in its linear region.

A transformer is normally designed for being capable of providing linear signal transfer in a limited range. However, under some circumstances, the amplitude of the voltage supplied to the transformer may be chosen below the linear range, which results in non-linear magnetization current flowing through the transformer, followed by a no load impedance that varies. Consequently, when such measured values are used for, for example fault detections, the inaccurate measurement may result in a false detection, leading to a false protection operation. By supplying a conditioning signal with a suitable amplitude value, the invention enables a linear operation of the transformer. Therefore, the qualities of the measured values are ensured.

According to one embodiment of the invention, the first and second frequencies have a non-harmonic relation. This means that the ratio between the frequency of the measurement signal and the frequency of the conditioning signal is neither an integer nor the inverse of an integer.

With both the measurement and the conditioning signal available on the transformer input, the measurement signal needs to be filtered out from the transformer output signal that is a superimposition of the measurement signal and the conditioning signal. However, when the transformer operates in non-linear region, it will generate harmonics out of any of sinusoidal input signals. Those harmonics will in turn appear in the output signal. By supplying the conditioning signal at the second frequency that does not have a harmonic relation with the frequency of the measurement signal, it is ensured that the transformer output signal will not contain a harmonic of the conditioning signal at the measurement signal frequency even if the conditioning signal harmonics are aliased. Consequently, the measurement result is not affected by the conditioning signal.

According to one embodiment of the invention, the voltage amplitude of the conditioning signal is 25-75% of the nominal voltage of the transformer. Therefore, the superimposed voltage amplitude of the measurement and conditioning signals will not exceed the nominal voltage of the transformer.

According to one embodiment of the invention, the measured voltage is obtained by sampling at a specific sampling rate and the second frequency is 30-50% of the sampling rate, which means that the second frequency may be set at the Nyquist frequency or slight below it. Therefore, the aliased harmonics of conditioning signal will only appear in the upper range of the available frequency band.

According to one embodiment of the invention, such a conditioning voltage signal is applicable to at least one of transformers connected in a measurement system that requires a galvanic insulation between a measurement circuit and instrumentation equipment, wherein the galvanic insulation comprises one or more transformers in a signal chain.

BRIEF DESCRIPTION OF THE DRAWINGS

The invention will now be explained more closely by the description of different embodiments of the invention and with reference to the appended figures.

DETAILED DESCRIPTION OF THE INVENTION

Figure 2A:
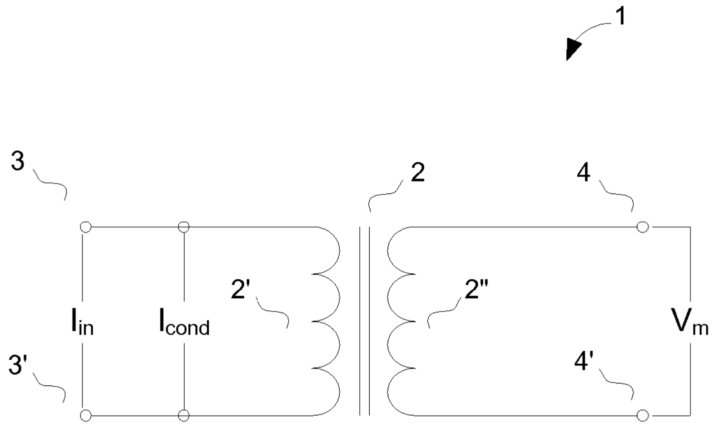
FIGS. 2A-B illustrate two exemplary schematic diagrams for enabling linear voltage transmission.
Figure 2B:
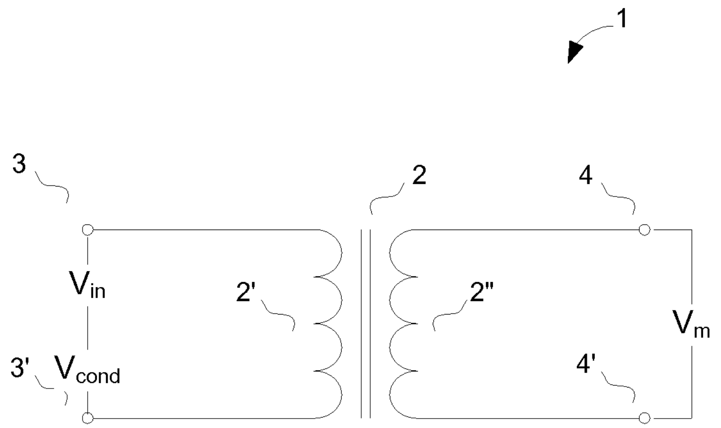

FIGS. 2*a* and 2*b* illustrate two exemplary schematic diagrams for enabling linear voltage transmission.

In the present embodiments, transformer 1 comprises a magnetic core 2 around which are disposed a primary winding 2' and a secondary winding 2". In these examples, a measurement signal is supplied to the primary winding 2' via terminals 3 and 3' at a first frequency, while the output signal is measured at the secondary winding 2" via connection terminals 4 and 4'.

Figure 1:
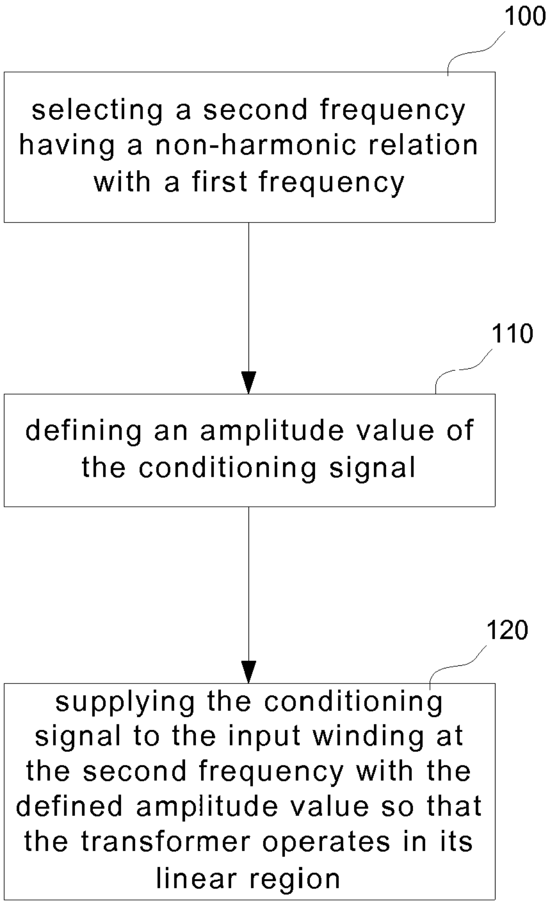
FIG. 1 shows a flow chart of the method, according to an embodiment of the invention.

In accordance with FIG. 1, for a conditioning signal, a second frequency is selected to be different from the first frequency, step 100. Additionally, the second frequency has a non-harmonic relation with the first frequency. The voltage amplitude of the conditioning signal is chosen such that the transformer operates in its linear region, step 110. The voltage amplitude of the conditioning signal may be selected in the range of 25-75% of the nominal voltage of the transformer so that the superimposition of the voltages based on the first and second signals will not exceed the nominal voltage of the transformer. Finally, the conditioning signal is supplied to the primary winding 2' of the transformer 1, step 120. Therefore, the transformer is ensured to operate in its linear region.

It should be understood that there might be various ways to supply the conditioning signal. FIGS. 2*a* and 2*b* illustrate two simple ways, which can be easily achieved by modifying the measurement circuit. Therefore, the solution of the present invention is economic comparing with the prior art.

For example, in the case that the measurement signal is a current signal $I_{in}$, a shunt branch for supplying the conditioning signal $I_{cond}$ may be added in parallel with the measurement signal $I_{in}$ source as illustrated in FIG. 2*a*. While in the case that the measurement signal $V_{in}$ is a voltage signal, a circuit for supplying the conditioning signal $V_{cond}$ is connected in series to the measurement voltage source $V_{in}$ as illustrated in FIG. 2*b*. The conditioning signal may have a square waveform or a sinusoidal waveform.

Figure 3:
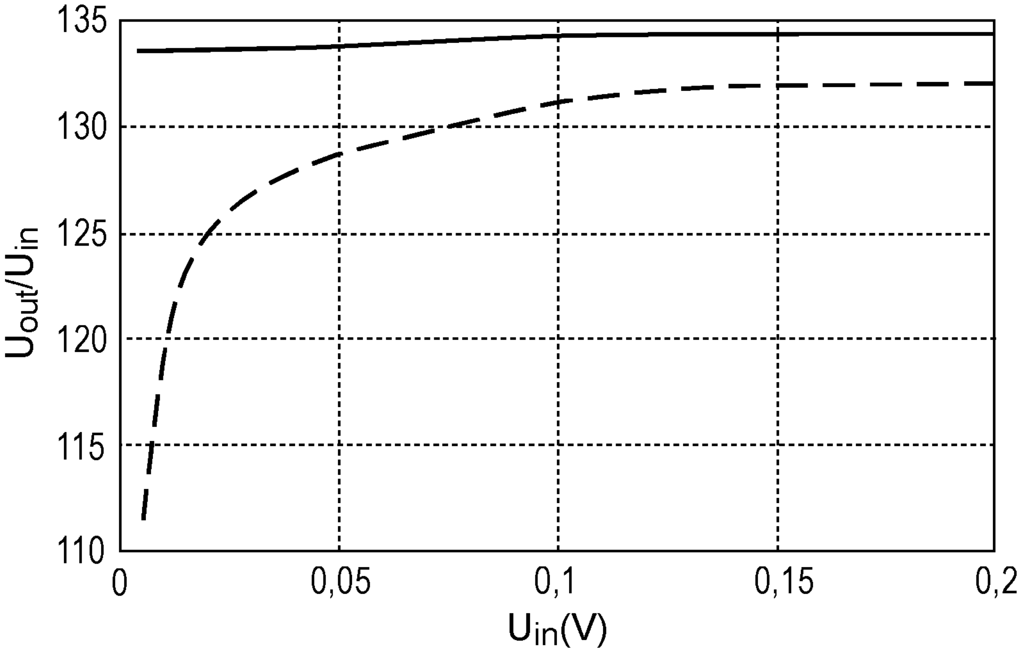
FIG. 3 illustrates a graph with ratios between output voltage and input voltage depending on the input voltage level with and without applying the invention.

FIG. 3 illustrates ratios between an output voltage and an input voltage depending on the input voltage level with and without applying the invention, respectively. The solid line represents a ratio between the output voltage and the input voltage depending on the input voltage level when the invention is applied, while the dashed line represents this ratio without applying the invention. It is clear that the ratio is kept almost constant, i.e. the output voltage keeps linearized with the input voltage, when the invention is applied. To the contrary, without the conditioning signal applied, the ratio is varying considerably until to the point when the transformer operates the linear region, in this example at $U_{in}$=0.1 V approximately.

Figure 4:
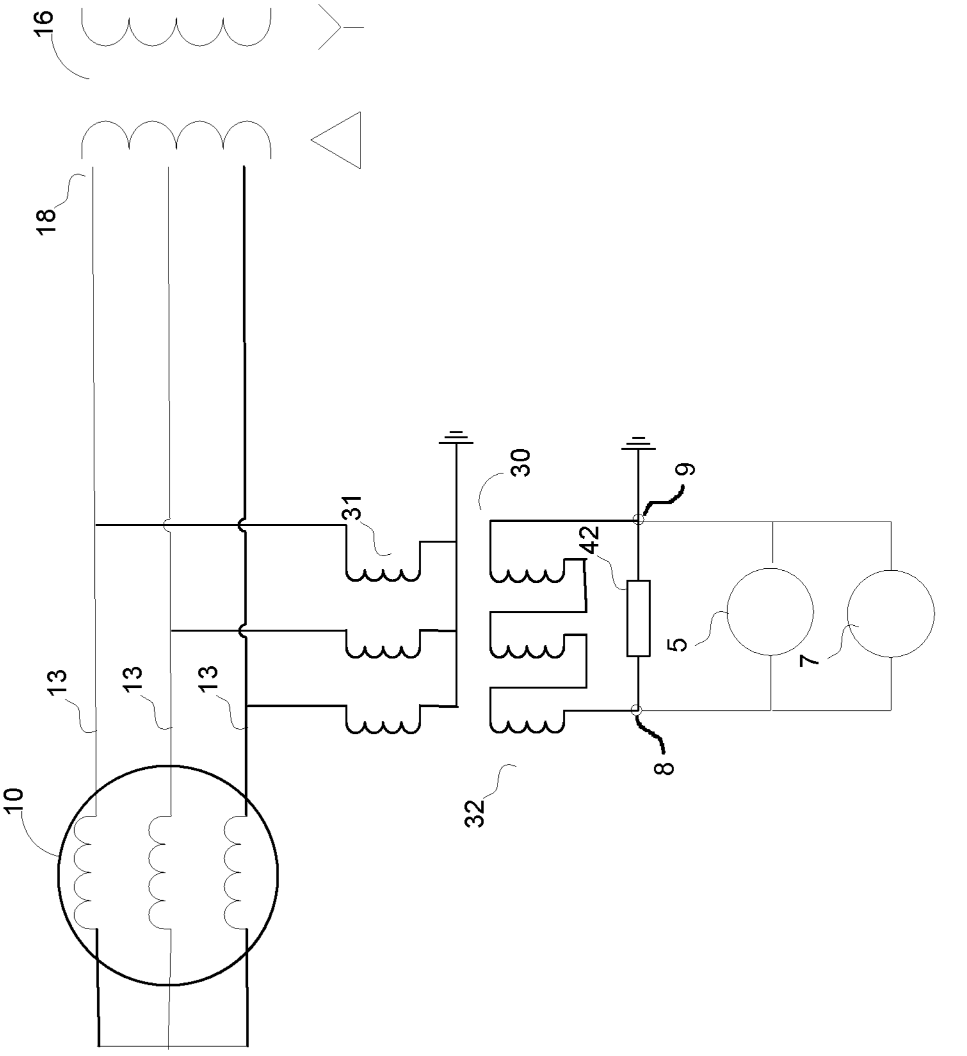
FIG. 4 illustrates a schematic diagram of a ground fault protection based on a signal injection scheme, wherein the signal is injected with low amplitude.

The present invention is intended to solve one specific problem that appears under some circumstances. This specific problem now is further explained in accordance with an example shown in FIG. 4, in which a schematic diagram of a ground fault protection for an electrical machine is illustrated.

In this example, a signal injection unit 5 is arranged for injecting a test signal in the stator windings 10 of a three-phase generator in order to detect ground faults. The injected test signal will be used as a measurement signal for detecting the ground faults.

The generator comprises stator windings 10 including terminals 13. The terminals 13 are connected to the primary windings of a unit transformer 16. The primary windings 18 of the unit transformer 16 are delta-connected to the terminals of the generator for isolating the generator from external faults of the network.

In accordance with this arrangement, a measurement system comprising a distribution transformer 30 is provided. The distribution transformer 30 is connected to the terminals 13 of the stator windings via its primary windings 31, while its secondary windings 32 are open-delta connected. A resistor 42 is connected to the two ends of the secondary windings 32 of the distribution transformer 30, which establishes a signal injection point via connection points 8 and 9. Furthermore, a measurement instrument 7 is connected to the two ends of the secondary windings 32 via the connection points 8 and 9. The resistor 42 is adapted to limit ground fault current to a value that limits the generator stator damages in case a ground fault occurs in the stator. This limit is typically in a range of 3-25 A.

Another important function of the distribution transformer is to provide galvanic insulations between the measurement circuit and the measurement instrumentation 7.

To be able to detect ground faults of the stator windings 10 of the generator, a test signal is injected at a predefined frequency to the stator windings 10 via the secondary windings 32 of the distribution transformer 30. Then, an electrical quantity of a response signal resulted from the injected test signal is measured at the secondary winding 32. A ground fault is detected thereof by a detecting unit (not shown in the figure) based on the measured signal.

It should be understood that the injected test signal is either a voltage or a current signal. If the injected test signal is a voltage signal, the response signal in the form of current will be measured or vice verse.

In this specific and uncommon circumstance, the distribution transformer 30 operates the voltage and current transformations in two directions. First, the test signal in the form of voltage is transformed from the injection unit 5 to the stator windings 10. Second, the response signal in the form of current is transformed from the stator windings 10 to the measurement 7.

The predefined frequency at which the test signal is injected may be selected in relation to the sampling rate at which output signal is measured, preferably, at a range of 10% of the sampling rate of the measured signal.

The voltage amplitude of the injected signal will be chosen below the linear range of the transformer so that the superimposed voltage of the injected signal and other signals, for example a system voltage, will not exceed the nominal voltage of the transformer and therefore, make the transformer overloaded.

Nevertheless, this ground fault detection scheme is intended to be applied to the generator at all states, even if it is at standstill.

However, when the generator is at standstill, no system voltage is present. The only signal through the distribution transformer 30 is the injected signal. Because the voltage amplitude of the injected signal is chosen below the linear range of the transformer, non-linear magnetization current flows through the transformer. Consequently, it results in inaccurate measured values, which may lead to a false operation of the ground fault protection, for example, a false trip may be initiated. This means that the signals in both directions described above will be affected by the non-linearity of the transformer 30.

By supplying a conditioning signal, the invention enables a linear operation of the distribution transformer 30. Therefore, the qualities of the measured values obtained from the measurement instruments 7 are ensured. In this example, the conditioning signal can be applied by either a parallel current shunt branch as shown in FIG. 2*a* or a series voltage connection as shown in FIG. 2*b*.

When the generator is started, the conditioning signal may be switched off conditionally as soon as the third harmonic signal generated by the generator is large enough. Similarly, the conditioning signal may be switched on during the deceleration when the third harmonic has decreased below a certain level.

It should be understood that although a generator is exemplified, the signal injection scheme including the present invention could be also applied to other types of electrical machines, for example an electrical motor.

What is claimed is:

1. A method for linearizing voltage transmission through a measurement transformer including a magnetic core and, input and output windings, wherein a measurement signal is supplied to the input winding at a first frequency and an output signal is measured at the output winding of the transformer, the method comprising the steps of:

superimposing a conditioning signal on the measurement signal when the magnitude of the measurement signal is lower than the magnitude needed to allow the transformer to operate in a non-linear region, wherein the superimposing the conditioning signal includes selecting a second frequency for the conditioning signal, the second frequency being different from the first frequency, defining an amplitude value of the conditioning signal, which amplitude lies within a linear operating region of the transformer and, supplying the conditioning signal to the input winding at the second frequency, wherein the first and second frequencies have a non-harmonic relation.

2. The method of claim 1 wherein the voltage amplitude of the conditioning signal is 25-75% of the nominal voltage of the transformer.

3. The method of claim 1 wherein the measured voltage is obtained by sampling at a specific sampling rate and the second frequency is 30-50% of the sampling rate.

4. The method of claim 1 wherein the measurement transformer is connected to a generator, said method being performed during standstill of the generator.

5. A method for linearizing voltage transmission through a measurement transformer including a magnetic core and, input and output windings, wherein a measurement signal is supplied to the input winding at a first frequency and an output signal is measured at the output winding of the transformer, the method comprising the steps of:

superimposing a conditioning signal on the measurement signal when the magnitude of the measurement signal is lower than the magnitude needed to allow the transformer to operate in a non-linear region, wherein the superimposing the conditioning signal includes, selecting a second frequency for the conditioning signal, the second frequency being different from the first frequency, defining an amplitude value of the conditioning signal, which amplitude lies within a linear operating region of the transformer and, supplying the conditioning signal to the input winding at the second frequency, wherein the voltage amplitude of the conditioning signal is 25-75% of the nominal voltage of the transformer.

6. The method of claim 5 wherein the first and second frequencies have a non-harmonic relation.

7. The method of claim 5 wherein the measured voltage is obtained by sampling at a specific sampling rate and the second frequency is 30-50% of the sampling rate.

8. The method of claim 5 wherein the measurement transformer is connected to a generator, said method being performed during standstill of the generator.

9. A method for linearizing voltage transmission through a measurement transformer including a magnetic core and, input and output windings, wherein a measurement signal is supplied to the input winding at a first frequency and an output signal is measured at the output winding of the transformer, the method comprising the steps of:

superimposing a conditioning signal on the measurement signal when the magnitude of the measurement signal is lower than the magnitude needed to allow the transformer to operate in a non-linear region, wherein the superimposing the conditioning signal includes, selecting a second frequency for the conditioning signal, the second frequency being different from the first frequency, defining an amplitude value of the conditioning signal, which amplitude lies within a linear operating region of the transformer and, supplying the conditioning signal to the input winding at the second frequency, wherein the measured voltage is obtained by sampling at a specific sampling rate and the second frequency is 30-50% of the sampling rate.

10. The method of claim 9 wherein the first and second frequencies have a non-harmonic relation.

11. The method of claim 9 wherein the voltage amplitude of the conditioning signal is 25-75% of the nominal voltage of the transformer.

12. The method of claim 9 wherein the measurement transformer is connected to a generator, said method being performed during standstill of the generator.

13. A method for linearizing voltage transmission through a measurement transformer including a magnetic core and, input and output windings, wherein a measurement signal is supplied to the input winding at a first frequency and an output signal is measured at the output winding of the transformer, the method comprising the steps of:

superimposing a conditioning signal on the measurement signal when the magnitude of the measurement signal is lower than the magnitude needed to allow the transformer to operate in a non-linear region, wherein the superimposing the conditioning signal includes, selecting a second frequency for the conditioning signal, the second frequency being different from the first frequency, defining an amplitude value of the conditioning signal, which amplitude lies within a linear operating region of the transformer and, supplying the conditioning signal to the input winding at the second frequency, wherein the measurement transformer is connected to a generator, said method being performed during standstill of the generator.

14. The method of claim 13 wherein the first and second frequencies have a non-harmonic relation.

15. The method of claim 13 wherein the voltage amplitude of the conditioning signal is 25-75% of the nominal voltage of the transformer.

16. The method of claim 13 wherein the measured voltage is obtained by sampling at a specific sampling rate and the second frequency is 30-50% of the sampling rate.

* * * * *